(12) United States Patent
Hasegawa

(10) Patent No.: US 7,255,575 B2
(45) Date of Patent: Aug. 14, 2007

(54) ELECTRICAL CONNECTING APPARATUS

(76) Inventor: Yoshiei Hasegawa, 2-B, Shiratori 2-chome, Asao-ku, Kawasaki-shi, Kanagawa-ken 215-0024 (JP)

( * ) Notice: Subject to any disclaimer, the term of this patent is extended or adjusted under 35 U.S.C. 154(b) by 0 days.

(21) Appl. No.: 11/584,137

(22) Filed: Oct. 20, 2006

(65) Prior Publication Data

US 2007/0099446 A1    May 3, 2007

(30) Foreign Application Priority Data

Apr. 27, 2004   (JP)   ............... PCT/JP2004/006076

(51) Int. Cl.
*H01R 12/00* (2006.01)
(52) U.S. Cl. ..................... 439/71; 324/755; 439/68
(58) Field of Classification Search ............... 439/68, 439/71, 591, 91, 66, 83; 324/755, 754
See application file for complete search history.

(56) References Cited

U.S. PATENT DOCUMENTS

| | | | | |
|---|---|---|---|---|
| 5,502,397 A * | 3/1996 | Buchanan | ............... | 324/754 |
| 5,713,744 A * | 2/1998 | Laub | ............... | 439/71 |
| 5,791,914 A * | 8/1998 | Loranger et al. | ............... | 439/71 |
| 6,084,421 A * | 7/2000 | Swart et al. | ............... | 324/755 |
| 6,394,820 B1 * | 5/2002 | Palaniappa et al. | ............... | 439/83 |
| 6,489,790 B1 * | 12/2002 | An et al. | ............... | 324/755 |
| 6,583,636 B2 * | 6/2003 | Brule | ............... | 324/755 |
| 6,776,624 B2 * | 8/2004 | Suematsu | ............... | 439/71 |
| 6,992,496 B2 * | 1/2006 | Winter et al. | ............... | 324/755 |

FOREIGN PATENT DOCUMENTS

| | | |
|---|---|---|
| EP | 0043199 A1 | 6/1981 |
| JP | 5744981 | 6/1981 |
| JP | 6140484 | 5/1994 |
| JP | 10506197 | 11/1995 |
| JP | 11160356 | 6/1999 |
| WO | WO 96/15458 | 5/1996 |

* cited by examiner

*Primary Examiner*—Michael C. Zarroli
(74) *Attorney, Agent, or Firm*—Jeffrey J. King; Black Lowe & Graham

(57) ABSTRACT

In the electrical connecting apparatus, a plurality of pins on a ceramic base plate so as to project from one face of the ceramic base plate, a resin base plate including a plurality of conductive portions electrically connected to those pins on the other face of the ceramic base plate and a plurality of recesses opening on the side of the ceramic base plate in the socket device so as to receive pins individually are disposed, and a plurality of pairs of holding members for releaseably holding the pins received in the recesses are provided, thereby coupling the ceramic base plate with the socket device and coupling the socket device with the wiring base plate.

16 Claims, 12 Drawing Sheets

ELECTRICAL CONNECTING APPARATUS

CROSS REFERENCE TO RELATED APPLICATIONS

This application claims the priority benefit of copending PCT/JP2004/006076, filed Apr. 27, 2004 are incorporated herein by reference.

TECHNICAL FIELD

The present invention relates to an electrical connecting apparatus such as a probe card for electrically connecting an integrated circuit as a device under test and an electric circuit of its inspection apparatus.

In the explanation herein, the thickness direction of each base plate is called vertical direction, the side of needle points of a contact relative to each base plate (the side of a semiconductor wafer) is called downward, and two directions of a rectangular coordinate parallel to each base plate are called X-direction and Y direction. However, in actual use of the electrical connecting apparatus, the thickness direction of each base plate may be made diagonal or lateral, and the upward and downward directions may be reversed.

BACKGROUND OF THE INVENTION

One of the electrical connecting apparatus of this type is provided with a so-called ceramic base plate made of ceramic, and a resin layer disposed on one face of the ceramic base plate, has a plurality of contacts formed in the resin layer (Patent Documents 1 and 2).

Patent Document 1—Patent Application Public Disclosure No. 6-140484 Official Gazette.

Patent Document 2—Patent Application Public Disclosure No. 11-160356 Official Gazette In the invention described in Patent Document 1, the resin layer is a made as a multilayered wiring layer in which wiring, contacts and the like are formed on the ceramic base plate by photolithography, and thus, the resin layer is adhered to the ceramic base plate.

In the invention described in Patent Document 2, the ceramic base plate is made as a multilayered wiring base plate having a number of wirings, wherein the resin layer is made contacts by opening a plurality of holes in a film with a resin thin film and a cupper thin film laminated, and the holes are filled with a metal material by electroplating and by removing unnecessary parts of a cupper thin film by etching. The resin layer is adhered to the ceramic base plate through anisotropic conductive rubber sheet.

On the other hand, integrated circuits as devices under test are different in position, function, dimension, arrangement pitch and the like, depending on the kinds of the integrated circuits of their electrodes.

In any of the above-mentioned prior arts, ceramic base plates hard to manufacture should be manufactured and prepared for each type of the integrated circuit; therefore, the ceramic base plate itself is expensive.

SUMMARY OF THE DISCLOSURE OF THE INVENTION

An object of the present invention is to enable a ceramic plate to be standardized, thereby realizing an inexpensive ceramic base plate.

The electrical connecting apparatus according to the present invention comprises: a ceramic base plate having a plurality of first conductive portions on one face, a plurality of second conductive portions electrically connected to the first conductive portion on the other face, and further, a plurality of pins electrically connected to the second conductive portions and projecting from the other face; an electrically insulating resin base plate disposed on the one face of the ceramic base plate and having a plurality of third conductive portions brought into contact with the first conductive portions on the face on the side of the ceramic base plate, the resin base plate further having a plurality of fourth conductive portions electrically connected to the third conductive portions on the face opposite to the side of the ceramic base plate; a plurality of contacts attached to the fourth conductive portions so as to be brought into contact with an electrode of a device under test; a plate-like socket device disposed on the other face of the ceramic base plate and having a plurality of recesses opening toward the face on the side of the ceramic base plate so as to receive the pins individually, the socket device including a plurality of pairs of holding members releaseably holding the pins received in the corresponding recesses; and a wiring base plate having a plurality of fifth conductive portions individually electrically connected to one of each pair of the holding members.

In the above-mentioned electrical connecting apparatus, it is possible to release the pins of the ceramic base plate held by the socket device to separate the ceramic base plate together with the resin base plate from the socket base plate, in turn, from the wiring base plate, and to couple the ceramic base plate together with the resin base plate with the socket device, in turn, with the wiring base plate by inserting the pins of the ceramic base plate into the recesses of the socket device and making the socket device hold the pins.

Consequently, it is possible to standardize the ceramic base plate, by moving arrangement patterns and connection patterns of the first and second conductive portions of the ceramic base plate to a common architecture, and producing resin base plates according to kinds of integrated circuits.

According to the standardized ceramic base plate, the ceramic base plates can be made cheap by producing ceramic base plates in bulk, and forming resin base plates according to kinds of integrated circuits on the ceramic base plates in stock, whereby a production period of the electrical connecting apparatus can be shortened.

Each pin may include a flange portion attached to the second conductive portion, and a pin-like principal portion extending from the flange portion so as to be received in the recess. Thus, the pins can be adhered to the second conductive portions in their flange portions with a conductive adhesive such as solder, which facilitates connection of the pins to the second conductive portions. Also, compared with a case of including no flange portion, the area of adhesion of the pin to the second conductive portion becomes large, so that the pin can be strongly connected to the second conductive portion.

The first and second conductive portions may be electrically connected by wiring or conductive through holes formed in the ceramic base plate, both ends of the through holes acting as the first and second conductive portions.

The resin base plate may further include a plurality of wirings arranged in multiple layers and for electrically connecting the third and fourth conductive portions. This enables to reduce the number of wirings to be formed on the ceramic base plate, or to dispense with forming the wiring on the ceramic base plate, thereby facilitating production of the ceramic base plate and making the ceramic base plate inexpensive.

Each of the contacts may be attached to the fourth conductive portions in a cantilever state. This bends the contacts when an overdrive acts, thereby absorbing irregularity in height position of needle points, to ensure connection of all the contacts to the electrodes of the integrated circuits.

Each of the contacts may be a plate-like contact including a mounting portion attached to the fourth conductive portion in a state of extending from the fourth conductive portion in the thickness direction of the ceramic base plate, an arm portion extending from the mounting portion in a direction intersecting the thickness direction, and a needle point extending from the front end of the arm portion toward the side opposite to the mounting portion. This enables to produce the contacts readily and inexpensively by electroforming such as electrolysis plating.

The arm portion has a first and a second arms at an interval in the thickness direction, and a first and a second connecting portions connecting the first and second arms respectively at their front ends and base ends, and may be supported by the mounting portion at their base ends and also may support the needle point portions at their front ends.

The socket device includes: a socket base plate located on the side of the wiring base plate; a movable base plate movable in one direction to intersect the thickness direction relative to the socket base plate and located on the side of the ceramic base plate relative to the socket base plate; an elastic body for exerting energizing force toward one side in the moving direction of the movable base plate; a cam for pushing the movable base plate toward the other side against the force of the elastic body; and an operation member for angularly rotating the cam; and the socket base plate and the movable base plate may form the recesses in cooperation; one of each pair of holding members may be attached to the socket base plate, and the other of each pair of holding members may be attached to the movable base plate. Thereby, in comparison with a case of fitting the pins of the ceramic base plate into the recesses of the socket device, the force required for attaching and removing the ceramic base plate to and from the socket device is remarkably small, to facilitate attachment and removal of the ceramic base plate to and from the socket device.

The socket device may further include a plurality of second pins connected to the one of the holding members and projecting from the socket base plate toward the wiring base plate, and the wiring base plate may further include a plurality of holes respectively fitting the second pins, each hole having a conductive inner face acting as the fifth conductive portion.

The socket device can further include a frame disposed between the wiring base plate and the resin base plate and around the socket base plate and the movable base plate so as to prevent movement of the socket base plate and to movably support the movable base plate. This facilitates mounting of the socket base plate and the movable base plate on the wiring base plate.

One of the frame and the movable base plate may have a pair of grooves for movably supporting the movable base plate at its edge portion on the frame at positions corresponding to a pair of opposing sides of a rectangle, and the other of the frame and movable base plate may have convex portions movably received in the grooves at positions corresponding to the pair of opposing sides of the rectangle. Thereby, the movable base plate can be movably supported without using such parts as balls and rolls.

The ceramic base plate and the socket device may be combined by a plurality of screw members penetrating the ceramic base plate and screwed into the socket device. This stabilizes the ceramic base plate relative to the socket device, eventually relative to the wiring base plate.

The electrical connecting apparatus may further comprise reinforcement members disposed on the side and the opposite side of the socket device of the wiring base plate, the reinforcement members being assembled into the wiring base plate and the socket device by a plurality of screw members penetrating the reinforcement members and the wiring base plate to be screwed into the socket device, while the ceramic base plate and the socket device may be combined by a plurality of screw members penetrating the ceramic base plate to be screwed into the socket device. Thus, the parallelism of the wiring base plate, socket device, ceramic base plate and resin base plate is maintained high.

The electrical connecting apparatus can further comprise a plurality of electronic parts, which are disposed on the side opposite to the socket device of the wiring base plate and electrically connected to the fifth conductive portions respectively, and reinforcement members located around the electronic parts.

The reinforcement members may have a frame portion located around the electronic parts and a plurality of arm portions extending in the radial direction of an imaginary circle from the frame portion, and be assembled into the wiring base plate and the socket device in the frame portion by a plurality of screw members, and mounted on the wiring base plate by a plurality of other screw members in the arm portion. Thus, the wiring base plate is not only reinforced but an area above the wiring base plate can be effectively utilized.

The electrical connecting apparatus can further comprise a plurality of connectors arranged on the wiring base plate, each of the connectors having a plurality of connecting portions electrically connected to the fifth conductive portions.

BEST MODE FOR CARRYING OUT THE INVENTION

Figure 1:
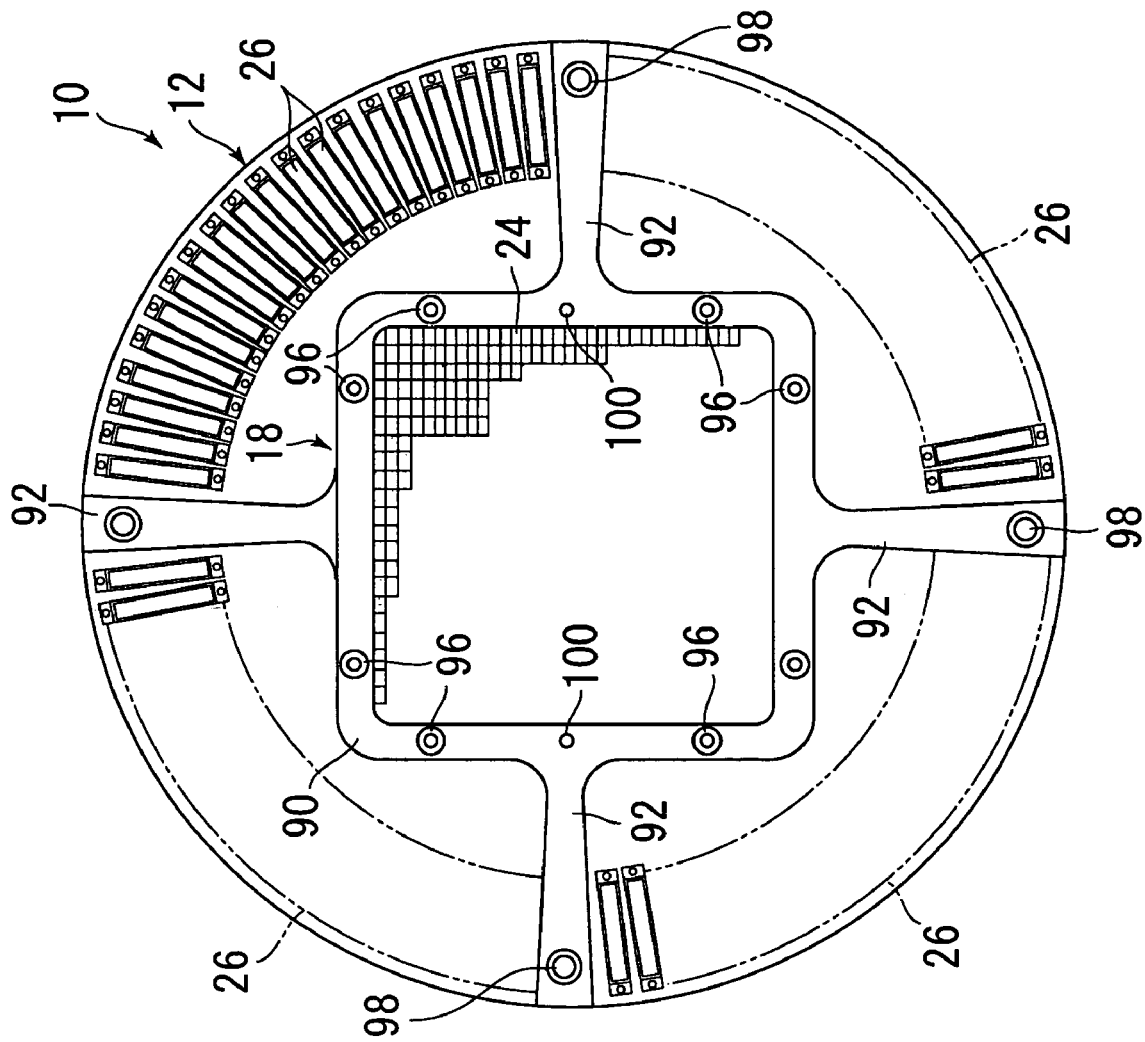
FIG. 1 is a plan view showing one embodiment of the electrical connecting apparatus according to the present invention.
Figure 2:
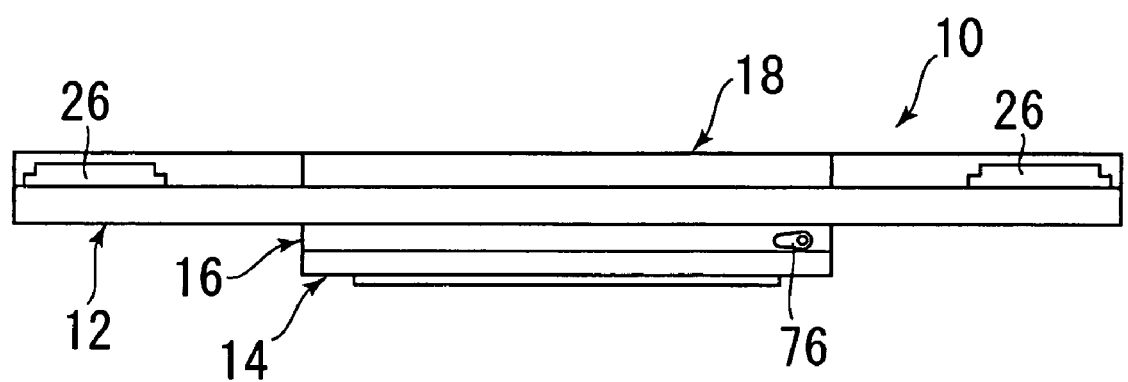
FIG. 2 is a front elevation of the electrical connecting apparatus shown in FIG. 1.
Figure 3:
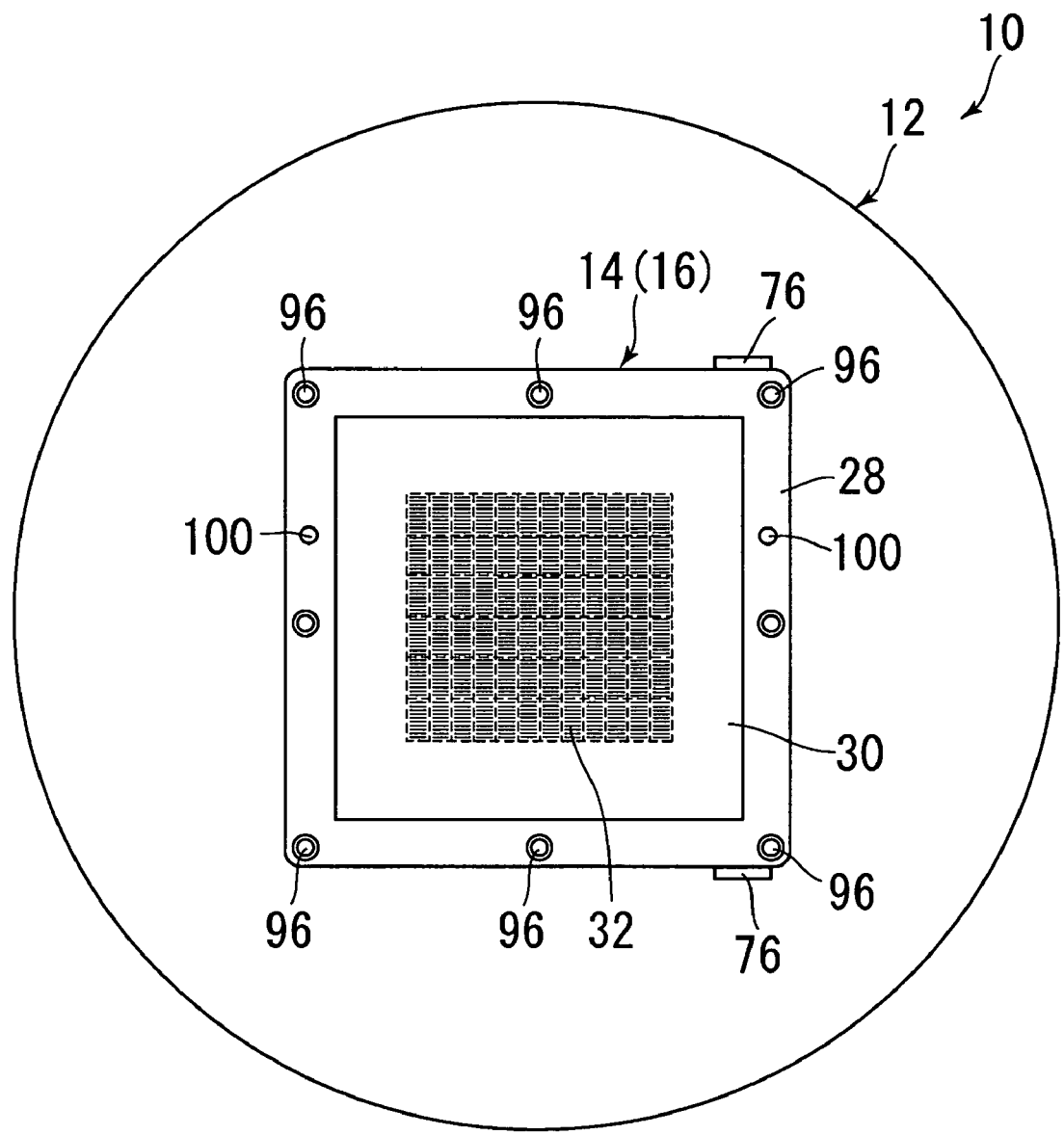
FIG. 3 is a bottom view of the electrical connecting apparatus shown in FIG. 1.
Figure 4:
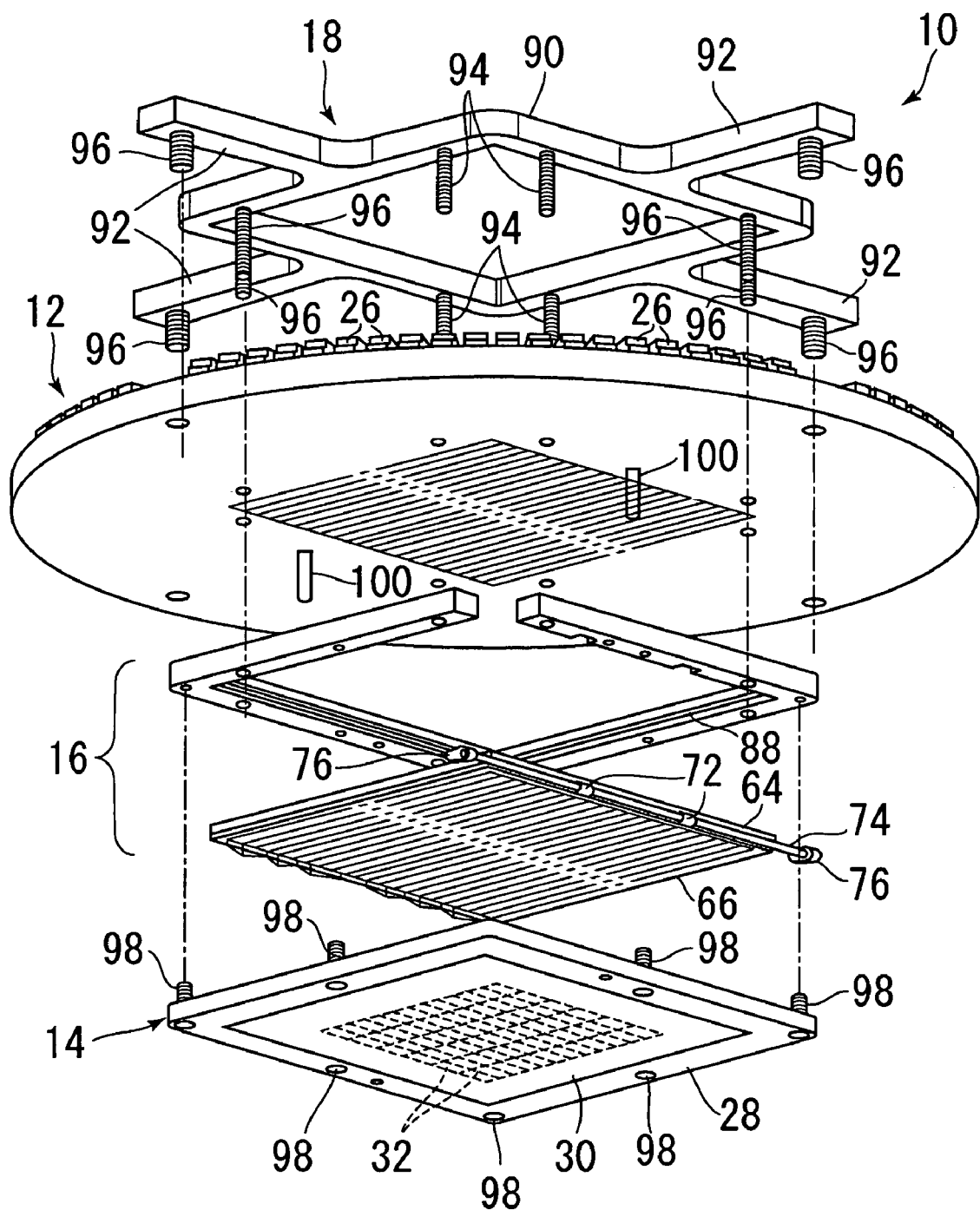
FIG. 4 is an explosive perspective view of the electrical connecting apparatus shown in FIG. 1 as seen from below.
Figure 5:
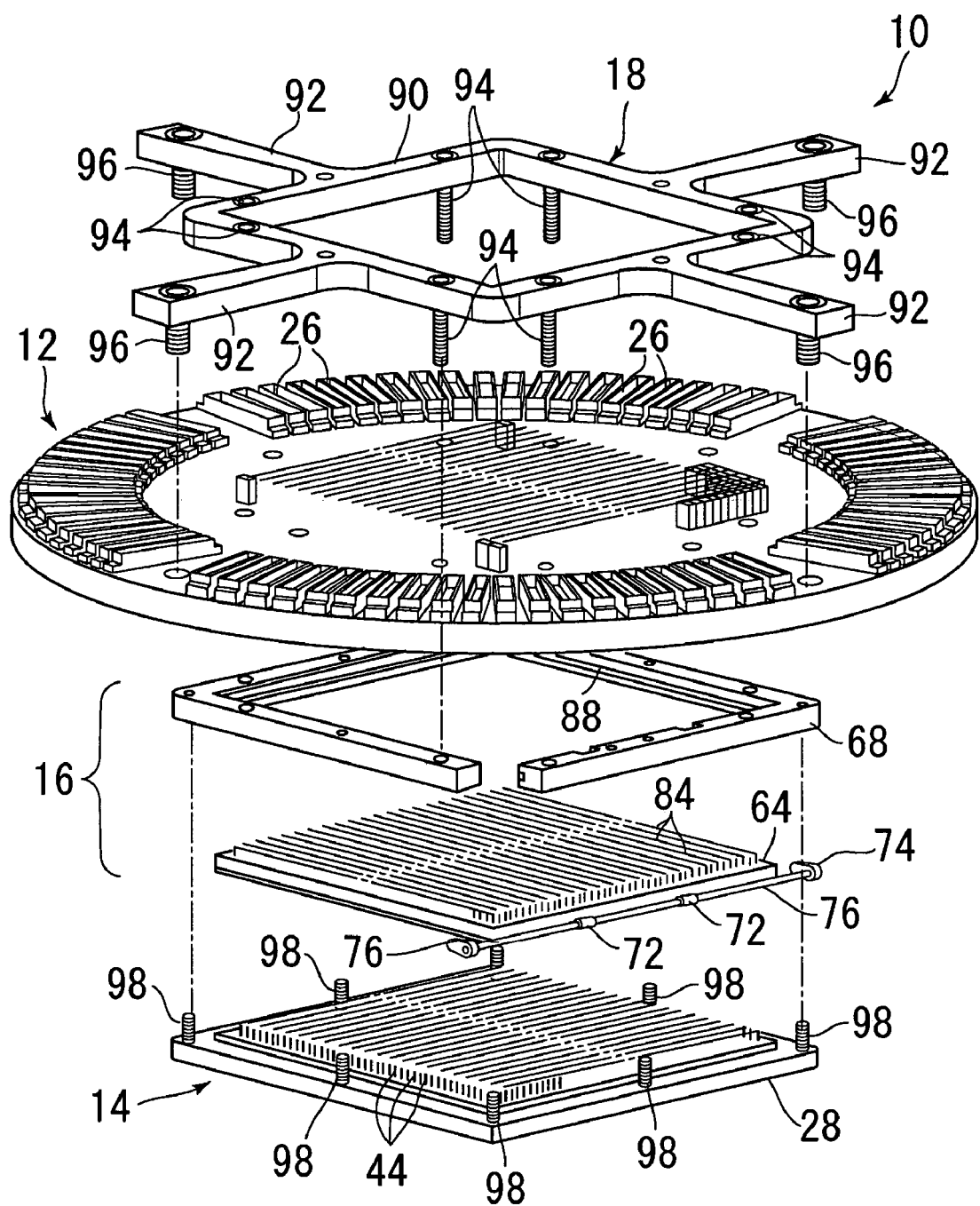
FIG. 5 is an explosive perspective view of the electrical connecting apparatus shown in FIG. 1 as seen from above.
Figure 6:
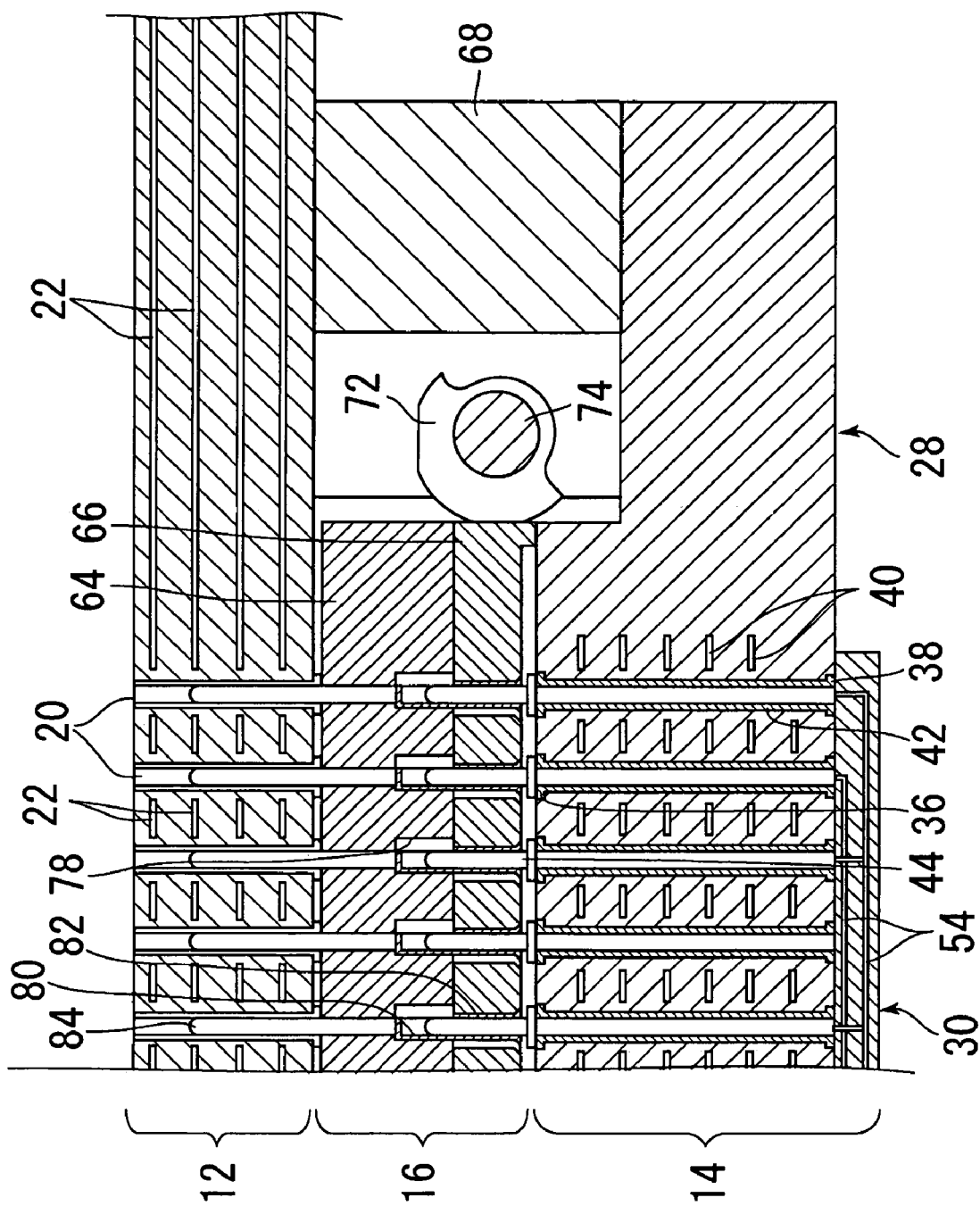
FIG. 6 is a vertical section with a part of the electrical connecting apparatus shown in FIG. 1 enlarged and with the upper part of the wiring base plate omitted.
Figure 7:
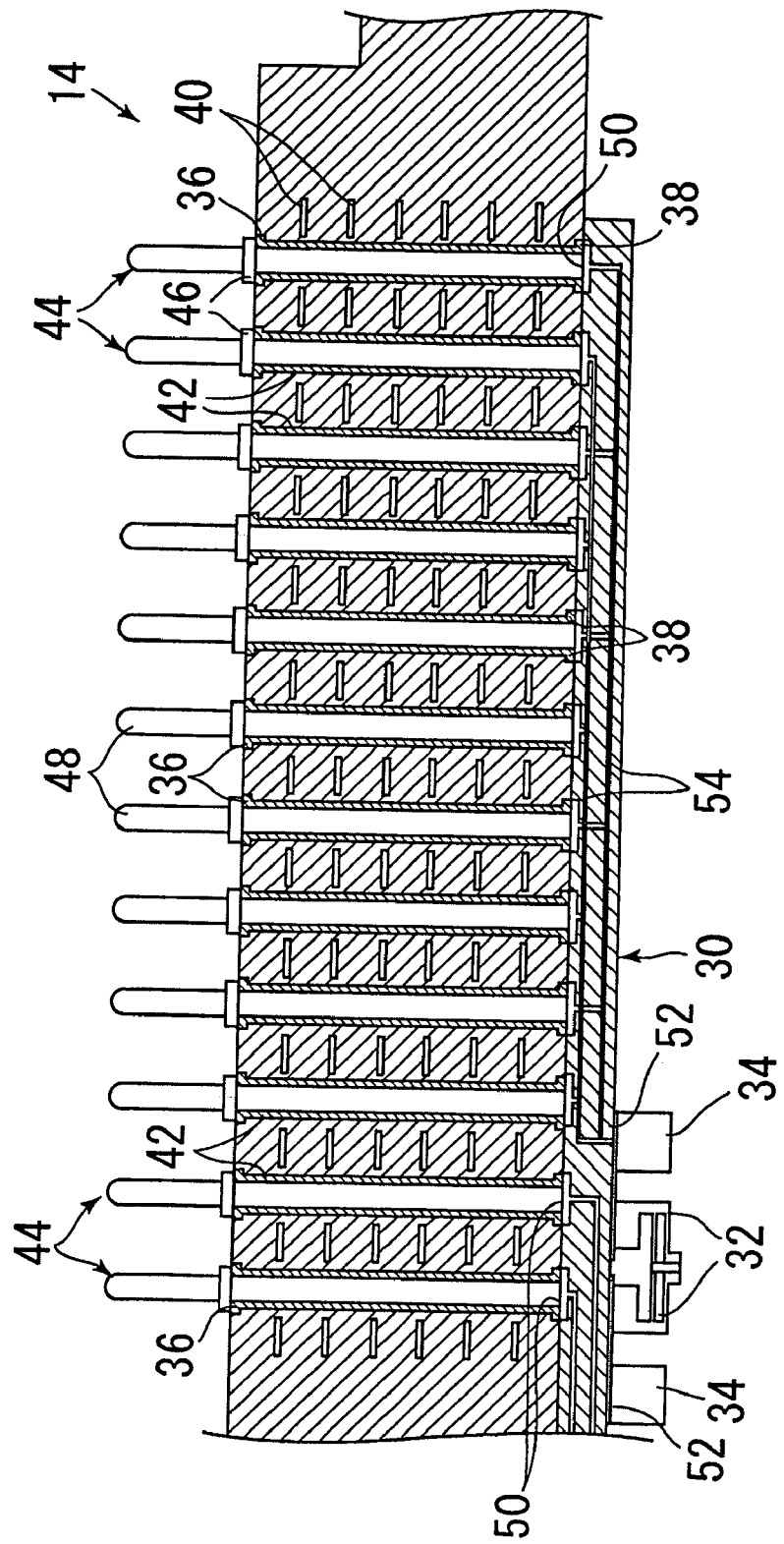
FIG. 7 is a vertical section with a part of a probe base plate enlarged.
Figure 8:
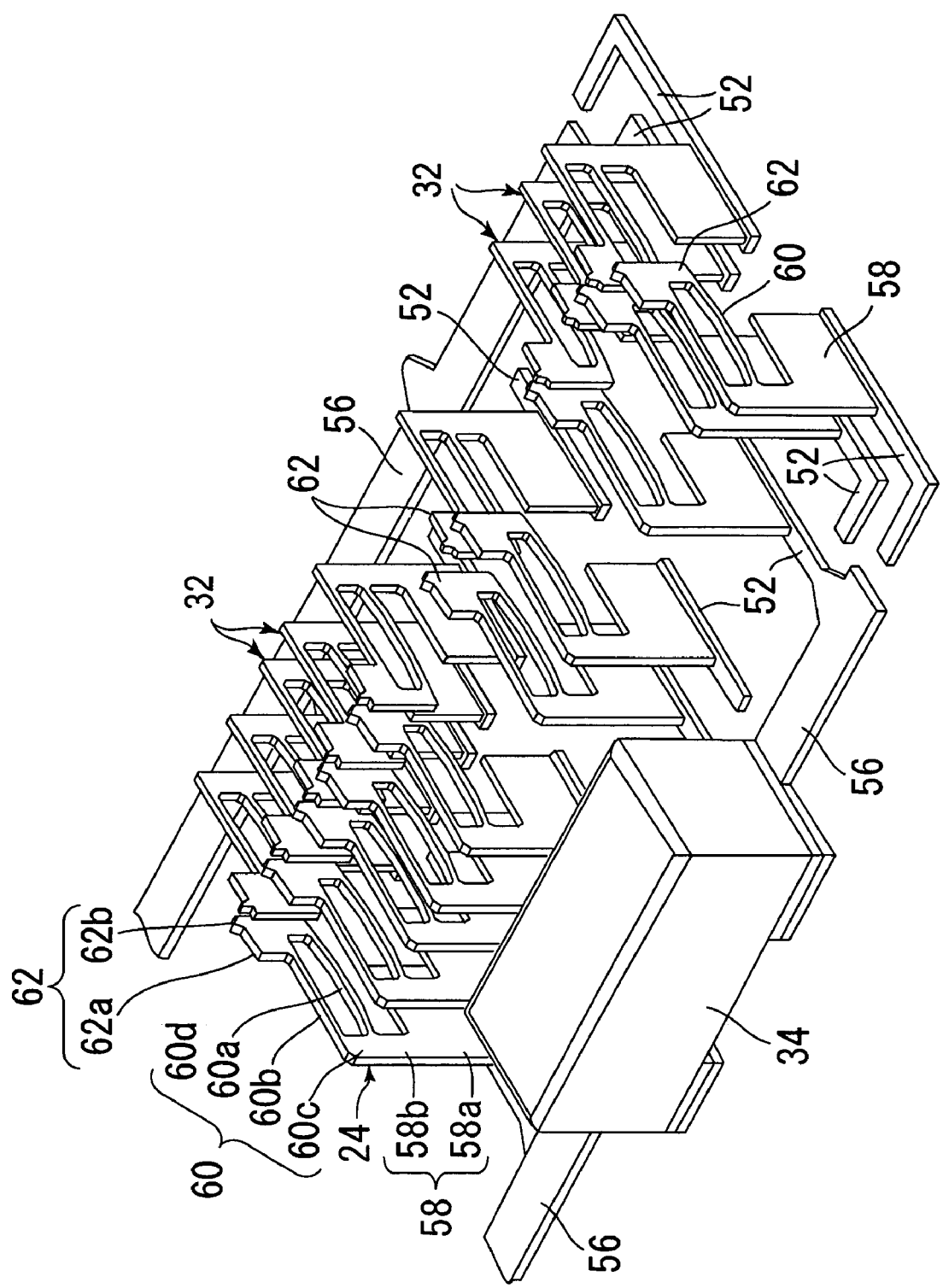
FIG. 8 is a perspective view showing a part of the underside of the resin base plate.
Figure 9:
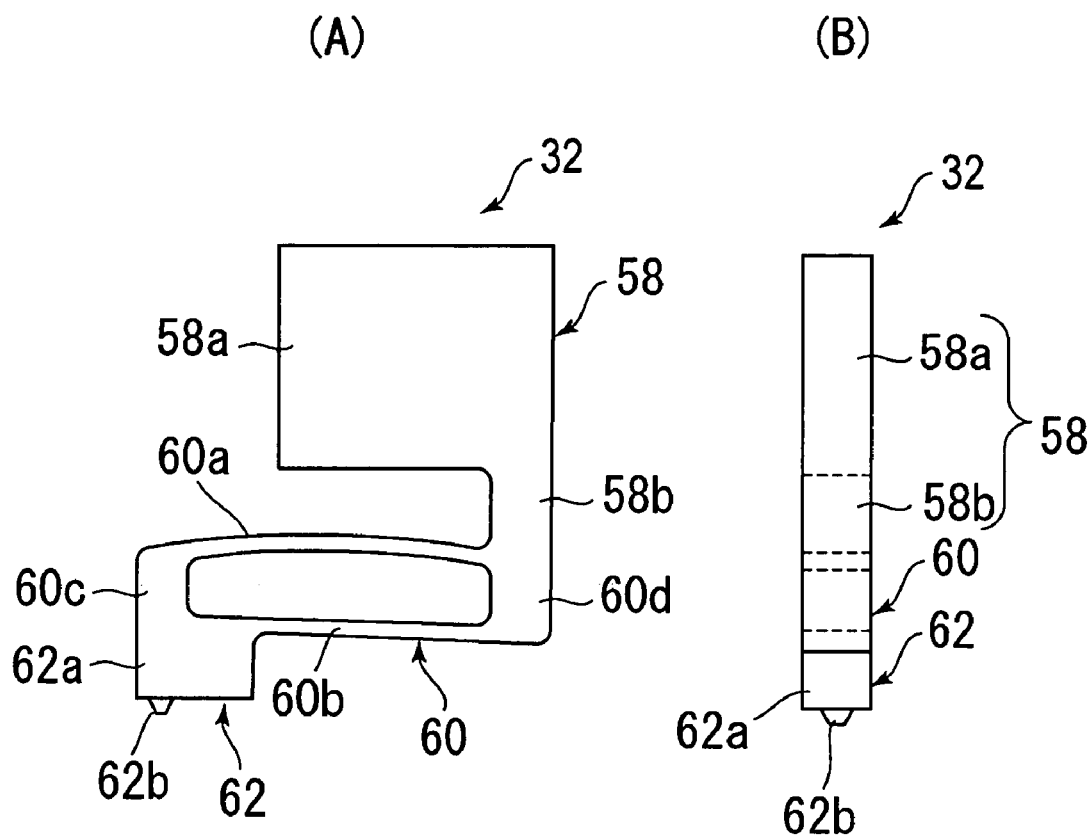
FIGS. 9(A) and (B) are views showing one embodiment of the contact, of which (A) is a front elevation and (B) a right side view.
Figure 10:
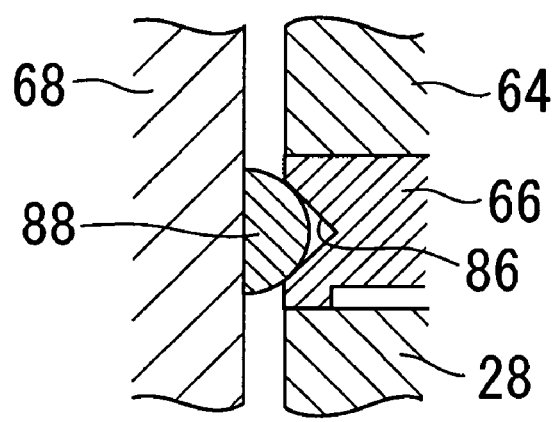
FIG. 10 is a perspective view showing one embodiment of the socket device.
Figure 11:
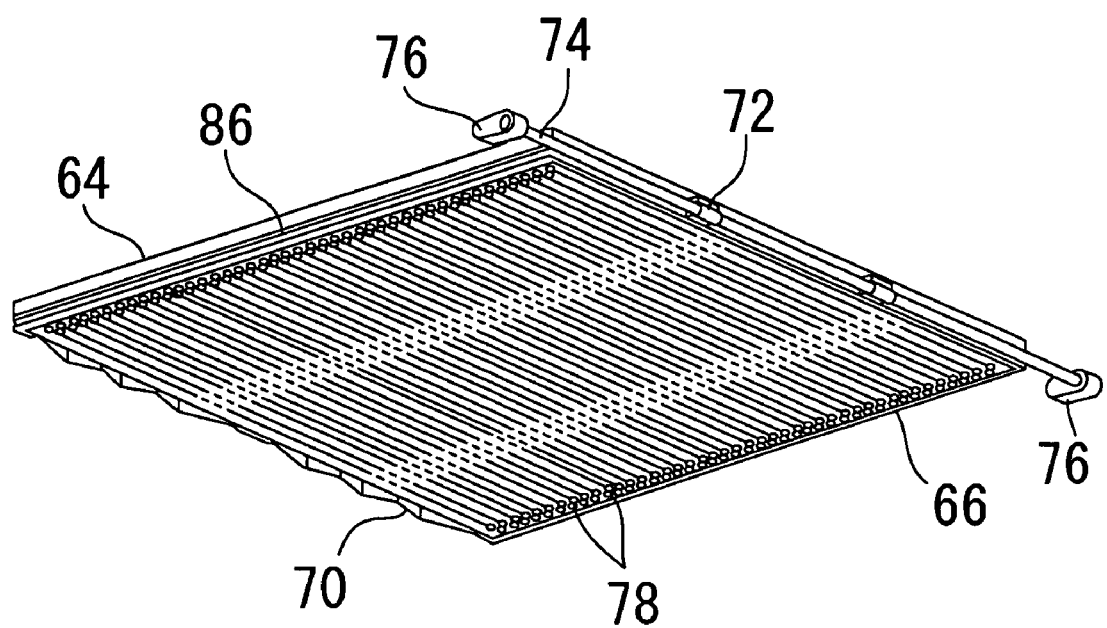
FIG. 11 is a sectional view showing a state of the movable base plate supported on the frame.
Figure 12:
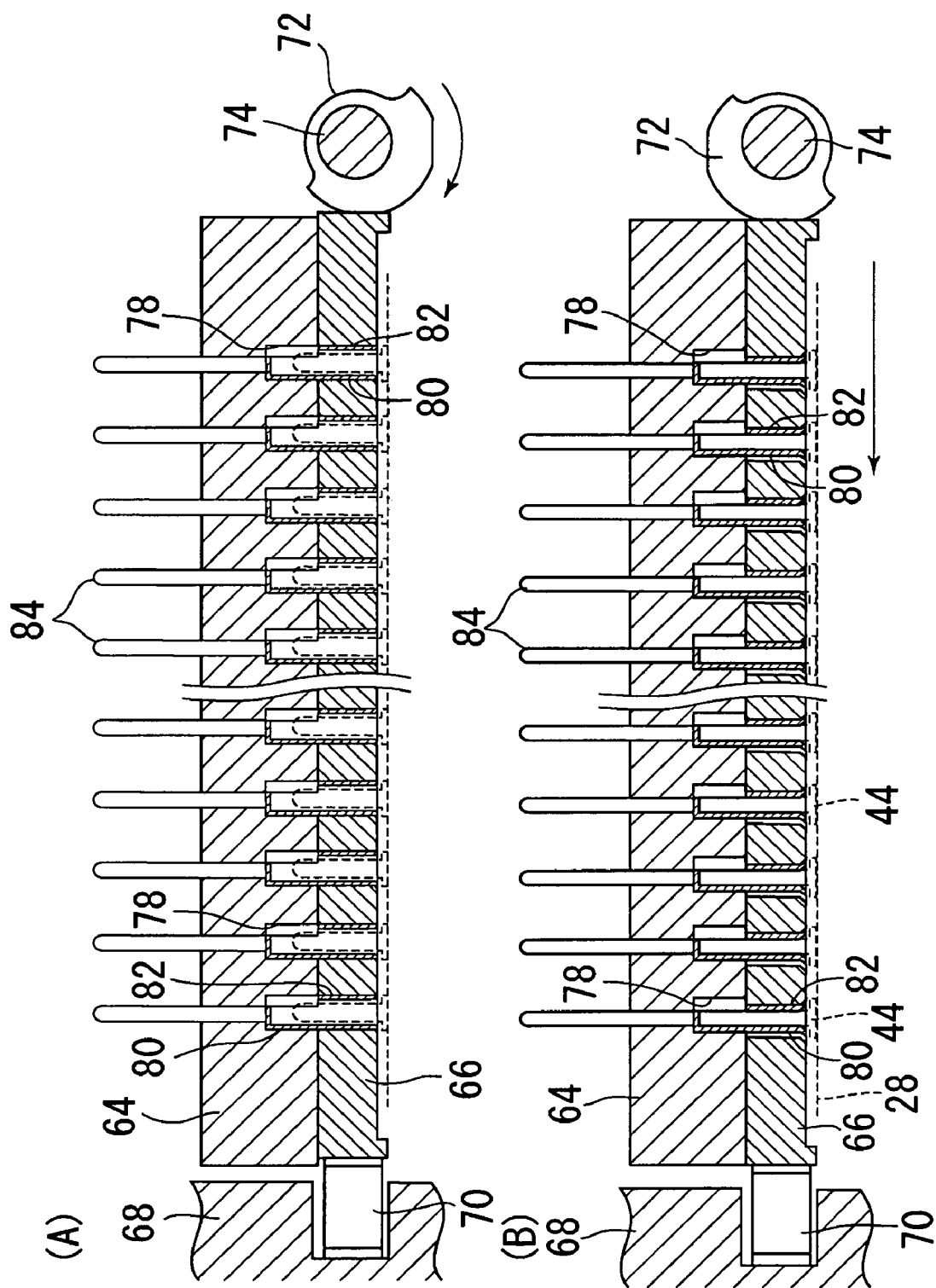
FIGS. 12(A) and (B) are vertical sections for explaining actions of the socket base plate, of which (A) is a view showing a state of the pins being released, and (B) a state of holding the pins.

Referring to FIGS. 1-12, the electrical connecting apparatus 10 deals with the integrated circuit having a plurality of electrodes for a power source, earth and signal such as an uncut integrated circuit formed on a semiconductor wafer or cut like chips as a device under test.

The electrical connecting apparatus 10 comprises a wiring base plate 12 attached to an inspection apparatus, a probe base plate 14 having a plurality of contacts 32 to be explained later, a flat plate-like socket device 16 to be removably attached to the underside of the wiring base plate with the probe base plate 14 removably attached to the underside of the wiring base plate 12, and a reinforcement member 18 disposed on the upper side of the wiring base plate 12.

The wiring base plate 12 is a circular multilayer wiring base plate having a plurality of wirings 22 electrically connected to the conductive portions 22 and has a plurality of conductive portions 20 in multiple layers. The electrodes of the integrated circuits as well as the conductive portions 20, and the conductive portions 20 as well as the wirings 22 are individually made to correspond, preferably, in one-to-one relationship. Such a wiring base plate 12 can be preferably made to correspond in one-to-one relation. Such a wiring base plate 12 can be produced by using glass-mixed epoxy.

Each conductive portion 20 is a so-called conductive through hole formed by a conductive cylindrical member extending within the wiring base plate 12 from the underside of the wiring base plate 12 up to a midway in the thickness direction of the wiring base plate.

In the center of the upper face of the wiring base plate 12, a plurality of electronic parts 24 such as a relay and a resistor are arranged in a substantially rectangular area as seen on a flat plane. Each electronic part 24 is in correspondence to an electrode for the power source or for signal and is adhered to a connection land (not shown) by a conductive adhesive material such as solder to be electrically connected to the wiring 22.

On the upper face of the wiring base plate 12 are also arranged a plurality of connectors 26 to be connected to the electric circuit of the inspection device. Each connector 26 is electrically connected to the conductive portion 20 through the wiring of the wiring base plate 12.

The probe base plate 14 forms a rectangular resin base plate 30 on the underside of the substantially rectangular ceramic base plate 28, and attaches a plurality of contacts 32 made to correspond individually to the electrode of the integrated circuit and an electronic part 34 such as a capacitor on the underside of the resin base plate 30. The height position of the lower end of the electronic part 34 is made upper than that of the lower end (needle point) of the contact 32.

The ceramic base plate 28 is provided with a plurality of conductive portions 36 and 38 on each face, and the conductive portions 36 and 38 are mutually electrically connected preferably in one-to-one correspondence through the conductive wirings 40 and cylindrical members 42. The conductive portions 36 and 38 are respectively made to be one ends and the other ends of the cylindrical members 42.

The cylindrical members 42 are shown to penetrate the ceramic base plate 28 in the thickness direction, but they are actually divided into upper and lower two members, and the upper member of one cylindrical member and the lower member of another cylindrical member 42 are electrically connected through the wiring 40.

It is, however, possible to make each wiring 40 a single cylindrical member 40 without having the wirings 40 on the ceramic base plate 28. In this case, the wiring 40 can be replaced with a reinforcement.

On the upper face of the ceramic base plate 28, a plurality of pins 44 are arranged to extend upward. Each pin 44 has a flange portion 46 and a pin-like principal portion 48 extending from the flange portion 46, and is electrically connected by a conductive adhesive such as solder to the upper conductive portion 36 at the flange portion 46.

This facilitates the connecting of the conductive portions 36 to the pins 44. Further, in comparison with a case of having no flange portion, an adhesive area of the pin to the conductive portion 36 becomes large, so that the pins 44 are firmly connected to the conductive portions 36.

The resin base plate 30 is directly formed on one face of the ceramic base plate 28 by using an electrically insulating resin such as polyimide. The resin base plate 30 has a plurality of conductive portions 50 and 52 acting on both faces thereof as connection pads, the conductive potions 50 and 52 are respectively electrically connected to each other preferably in one-to-one correspondence.

Wiring 56 for the power source or for the earth is exposed at the underside of the resin base plate 30 and connected to the electronic part 34 such as a capacitor. The conductive portions 52 connected to the wiring portions 56 are used as pad portions for the power source or for the earth. The other conductive portions 52 are used as pad portions for signal.

Each contact 24 is formed as a plate-like contact (probe) including a mounting portion 58 mounted on the conductive portion 52 of the resin base plate 30, an arm portion 60 extending downwardly from the mounting portion 58, and a tip portion 62 extending from the front end of the arm portion 60 in the direction (downward) opposite to the mounting portion 58.

The mounting portion 58 has a rectangular plate-like area 58a and an extension 58b extending from the plate-like area 58a to reach the arm portion 60.

The arm portion 60 has a first arm 60a and a second arm 60b at a vertical interval as well as a first connecting portion 60c and a second connecting portion 60d respectively connecting the first and the second arms 60a and 60b at their front ends and the base ends. The arm portion 60 is supported by the extension 58b of the mounting portion 58 at the base end and supports the needle point portion 62 at the front end.

The needle point portion 62 has a pedestal 62a continuous with the lower end of the front end side of the arm portion 60 and a projected tip 62b provided at the lower end of the pedestal 62a.

Each contact 24 is adhered to the conductive portion 52 at the plate-like area 58 of the mounting portion 58 by a conductive adhesive such as solder so as to extend downward from the resin base plate 30.

Even if each contact 24 has such a complicated structure as mentioned above, it can be easily and inexpensively manufactured by an electroforming such as electrolytic plating.

The socket device 16 has a substantially rectangular plate form as a whole with a socket base plate 64 located on the side of the wiring base plate 12, the movable base plate 66 which is movable in one direction within a horizontal plane relative to the socket base plate 64, and a frame 68 disposed around the socket base plate 64 and the movable base plate 66.

The socket device 16 also includes an elastic body 70 for exerting energizing force to one side in the moving direction of the movable base plate 66, a pair of cams 72 for pushing the movable base plate 66 releaseably toward the other side against the force of the elastic body 70 like a leaf spring, a support shaft 74 to which the cams 72 are attached so as not to move relatively, and an operation member 76 attached to each end of the support shaft so as to angularly rotate the cams 72.

The socket base plate 64 and the movable base plate 66 form in cooperation a plurality of recesses 78 opening on the face of the ceramic base plate 28 so as to receive the pins 44 of the ceramic base plate 28 individually.

The recesses 78 are made to correspond respectively to the cylindrical conductive portions 20 of the wiring base plate 12. Of the recesses 78, those on the socket base plate 64 are so-called holes with bottom, and those on the movable base plate are through holes communicating to the holes with bottom.

In each recess 78, a pair of holding members 80, 82 are disposed so as to releasseably hold the pin 44 received in the recess 78 with the movement of the movable base plate 66. The holding member 80, one of each pair, is attached to the socket base plate 64 so as not to move relatively, while the holding member 82, the other of each pair, is attached to the movable base plate 66.

Also, on the socket base plate 64, a plurality of pins 84 are disposed so as to project upward of the socket base plate 64 from the holding members 80. Each pin 84 is electrically connected to the holding member 80 and inserted into the cylindrical conductive portion 20 of the wiring base plate 12. By this, the socket base plate 64 is prevented from moving with respect to the wiring base plate 12.

The movable base plate 66 has a pair of grooves 86 extending in this moving direction in opposing edge portions of a rectangle, and the frame 68 has a convex portion 88 movably received in the groove 86 at a position corresponding to the opposite side of the rectangle. However, the groove 86 may be formed in the frame 68, and the convex portion 88 may be formed in the movable base plate.

According to either example as mentioned above, the movable base plate 66 is moved between the position for forming the recess 78 opening so as to receive the pin 44 and the position to sandwich the received pin 44 by the holding members 80, 82. The socket base plate 64 is mounted on the movable base plate 66. If the groove 86 and the convex portion 88 are used for supporting such a movable base plate 66, the movable base plate 66 can be movably supported in the frame 68 without using such parts as a ball and a roll.

The support shaft 74 is rotatably supported in the frame 68 so as to intersect the moving direction of the movable base plate 66 to extend horizontally.

The cams 72 are attached to the support shaft 74 at an interval in the longitudinal direction of the support shaft 74 so as to be angularly rotated within a perpendicular plane including the moving direction of the movable base plate 66. The outer circumferential face of each cam 72 has a first cam face with a large radius of curvature and a second cam face with a small radius of curvature.

The operation members 76 are attached to the end portion of the support shaft so as to rotate the support shaft 74 at a position where the first cam face abuts on the side face of the movable base plate 66 and at a position where the second cam face abuts on the side face of the movable base plate 66.

The socket device 16 such as above can attach and remove the ceramic base plate 28 with remarkably small force in comparison with a case where the pins 44 of the ceramic base plate 28 are fitted into the recesses 78 in a cantilever state, thereby facilitating attaching and removing the ceramic base plate 28 relative to the socket device 16.

Also, the socket device 16 prevents the socket base plate 64 from moving and movably supports the movable base plate 66 by means of the frame 68, which facilitates mounting of the socket base plate 64 and the movable base plate 66 on the wiring base plate 12.

The reinforcement member 18 has a substantially rectangular frame portion 90 located around the electronic parts 24 and a plurality of arm portions 92 extending from the frame portion 90 in the radial direction of an imaginary circle. Because of this, the wiring base plate 12 is not only reinforced but also an area on the upper face of the wiring base plate 12 can be effectively utilized.

The reinforcement member 18 is assembled into the wiring base plate 12 and the socket device 16 at the frame portion 90 by means of a plurality of screw members 94 penetrating the reinforcement member 18 and the wiring base plate 12 and screwed into the frame 68, and is also assembled into the wiring base plate 12 at the arm portion 92 by means of a plurality of screw members 96 penetrating the reinforcement member 18 and screwed into the wiring base plate 12.

The probe base plate 14 is assembled into the socket device 16 by means of a plurality of screw members 98 penetrating the ceramic base plate 28 and screwed into the frame 68.

The wiring base plate 12, the probe base plate 14 and the socket device 16 are relatively positioned by means of a plurality of positioning pins 100 extending from the wiring base plate 12 through the frame 68 and inserted into the ceramic base plate 28.

When inspecting, in the electrical connecting apparatus 10, the tips 62b of the contacts 24 are pressed by the electrode of the integrated circuit. At this time, the cantilever-like contacts 24 are deflected by an overdrive acting thereon at the arms 60a, 60b. Thereby, the irregularity of the height positions of the tips 62b are absorbed, and all the contacts 24 are surely brought into contact with the electrode of the integrated circuit.

In the electrical connecting apparatus 10, when the cams 72 are rotated by the operation members 76 from the state shown in FIG. 12(A) so that the first cam face may abut the side face of the movable base plate 66, the movable base plate 66 is pushed against the force of the elastic body 70. As a result, as shown in FIG. 12(B), the holding members 80, 82 hold the pins 44 of the ceramic base plate 28, and the probe base plate 14 is mounted on the socket device 16, eventually on the wiring base plate 12.

On the other hand, when the cams 72 are rotated by the operation members 76 from the state shown in FIG. 12(B) so that the second cam face may abut a side face of the movable base plate 66, the movable base plate 66 is pushed back by the force of the elastic body 70. By this, the holding members 80, 82 release holding of the pins 44. In this state, attaching and removing of the probe base plate 14 to and from the socket device 16 are carried out.

According to the electrical connecting apparatus 10, as mentioned above, the ceramic base plate 28 can be separated together with the resin base plate 30 from the socket base plate 64, eventually from the wiring base plate 12 by releasing the holding of the pins 44 of the ceramic base plate 28 by the holding members 80, 82, and also, the ceramic base plate 28 can be combined together with the resin base plate 30 with the socket device 16, eventually with the wiring base plate 12, by inserting the pins 44 of the ceramic base plate 28 into the recesses 78 of the socket device 16.

Therefore, the ceramic base plate 28 can be standardized by making the arrangement pattern and the connection pattern of the conductive portions 36, 38 of the ceramic base plate 28 common and producing the resin base plate 30 having patterns according to kinds of the integrated circuit.

The standardized ceramic base plate 28 can be made inexpensive by mass production, and by forming the resin base plate 30 according to kinds of the integrated circuit on the ceramic base plate 28 in stock, a production period of the electrical connecting apparatus 10 can be shortened.

By using the ceramic base plate 28 and the resin base plate 30 as the probe base plate 14, the number of wirings to be formed on the ceramic base plate 28 can be reduced, and in an extreme case, there is no need to form the wiring on the ceramic base plate 28, thereby facilitating the production of the ceramic base plate 28 and making the ceramic base plate inexpensive.

Also, according to the electrical connecting apparatus 10, the reinforcement member 18 is assembled into the wiring base plate 12 and the socket device 16 by a plurality of screw members 96 penetrating the reinforcement member 18 and the wiring base plate 12 and screwed into the socket device 16, and the ceramic base plate 28 and the socket device 16 are combined by a plurality of screw members 98 penetrating the ceramic base plate 28 and screwed into the socket device 16, so that the parallelism of the wiring base plate 12, the socket device 16, the ceramic base plate 28 and the resin base plate 30 is maintained high.

However, it is not always necessary to provide with the reinforcement member 18. In that case, it suffices to combine the wiring base plate 12 and the frame 68 by means of a plurality of screw members.

The present invention is not limited to the foregoing embodiments but can be variously modified without departing from its purpose.

What is claimed:

1. An electrical connecting apparatus comprising:
   a ceramic base plate provided with a plurality of first conductive portions on one face, a plurality of second conductive portions electrically connected with said first conductive portions on the other face, and further, a plurality of pins electrically connected with said second conductive portions and projecting from said other face;
   an electrically insulating resin base plate disposed on the one face of said ceramic base plate and having a plurality of third conductive portions brought into contact with said conductive portions on a side face of said ceramic base plate, and having a plurality of fourth conductive portions electrically connected with said third conductive portions on a face opposite to the side of said ceramic base plate;
   a plurality of contacts attached to said fourth conductive portions so as to be brought into contact with an electrode of a device under test;
   a plate-like socket device disposed on said other face of said ceramic base plate, said socket device having a plurality of recesses opening toward the face of said ceramic base plate so as to receive said pins individually and having a plurality of pairs of holding members disposed individually in said recesses for releaseably holding said pins received in the corresponding recesses; and
   a wiring base plate disposed on the other face of said socket device and having a plurality of fifth conductive portions electrically connected to one of each pair of said holding members.

2. An electrical connecting apparatus claimed in claim 1, wherein each of said pins has a flange portion attached to said second conductive portion, and a pin-like principal portion extending from said flange portion so as to be received in said recess.

3. An electrical connecting apparatus claimed in either claim 1 or 2, wherein said first and second conductive portions are electrically connected to each other by the wiring formed on said ceramic base plate or a conductive through hole whose both ends act as said first and second conductive portions.

4. An electrical connecting apparatus claimed in one of claims 1 and 2, wherein said resin base plate further has a plurality of wiring portions arranged in multiple layers and electrically connecting said third and fourth conductive portions.

5. An electrical connecting apparatus claimed in one of claims 1 and 2, wherein each of said contacts is attached to said fourth conductive portion in a cantilever state.

6. An electrical connecting apparatus claimed in claim 5, wherein each of said contacts is a plate-like contact including a mounting portion mounted on said fourth conductive portion so as to extend from said fourth conductive portion in the direction of the thickness of said ceramic base plate, an arm portion extending from one end of said mounting portion in the direction intersecting said thickness direction, and a tip portion extending from the front end side of said arm portion in the direction opposite to said mounting portion.

7. An electrical connecting apparatus claimed in claim 6, wherein said arm portion has a first and a second arms spaced apart in said thickness direction, and a first and a second connecting portions for connecting said first and second arms respectively at their front end and base end portions, and said arm portion being supported by said mounting portion at said base end portion and supporting said tip portion at said front end portion.

8. An electrical connecting apparatus claimed in one of claims 1 and 2, wherein said socket device includes: a socket base plate located on the side of said wiring base plate; a movable base plate movable in one direction intersecting said thickness direction relative to said socket base plate and located on the side of said ceramic base plate relative to said socket base plate; an elastic body for applying energizing force toward one side in the moving direction of said movable base plate to said movable base plate; a cam for pushing releaseably said movable body toward the other side against the force of said elastic body; and an operation member for angularly rotating said cam,
   wherein said socket base plate and said movable base plate cooperate to form said recesses, one of each pair of holding members is mounted on said socket base plate, and the other of each pair of holding members is mounted on said movable base plate.

9. An electrical connecting apparatus claimed in claim 8, wherein said socket device further has a plurality of second pins connected to one of each pair of said holding members and projecting from said socket base plate toward said wiring base plate, wherein said wiring base plate further has a plurality of holes individually fitting said second pins, each hole having a conductive inner face acting as said fifth conductive portions.

10. An electrical connecting apparatus claimed in claim 8, wherein said socket device further includes a frame located between said wiring base plate and said resin base plate and disposed around said socket base plate and said movable base plate so as to prevent said socket base plate from moving and so as to movably support said movable base plate.

11. An electrical connecting apparatus claimed in claim 10, wherein one of said frame and said movable plate has a pair of grooves for movably supporting said movable base plate at its edge portion, at positions corresponding to a pair of opposing sides of a rectangle, and wherein the other of said frame and said movable base plate has a convex portion movably received in said grooves at positions corresponding to a pair of opposing sides of said rectangle.

12. An electrical connecting apparatus claimed in one of claims 1 and 2, wherein said ceramic base plate and said socket device are combined by a plurality of screw members penetrating said ceramic base plate and screwed into said socket device.

13. An electrical connecting apparatus claimed in one of claims 1 and 2, further comprising: a reinforcement member disposed on the side opposite to the side of the socket device of said wiring base plate, wherein said reinforcement member is assembled into said wiring base plate and said socket device by a plurality of screw members penetrating said reinforcement and said wiring base plate and screwed into said socket device, and wherein said ceramic base plate and socket device are coupled by a plurality of screw members penetrating said ceramic base plate and screwed into said socket device.

14. An electrical connecting apparatus claimed in one of claims 1 and 2, further comprising a plurality of electronic parts disposed on the side opposite to the socket device of said wiring base plate and respectively electrically connected with said fifth conductive portion, and a reinforcement member located around the electronic parts.

15. An electrical connecting apparatus claimed in claim 14, wherein said reinforcement member includes a frame portion located around the electronic parts and a plurality of arm portions extending from said frame portion in the radial direction of an imaginary circle, said reinforcement member being assembled into said wiring base plate and said socket device in said frame portion by a plurality of screw members and attached to said wiring base plate in said arm portion by a plurality of another screw members.

16. An electrical connecting apparatus claimed in one of claims 1 and 2, further comprising a plurality of connectors disposed in said wiring base plate and including a plurality of connecting portions respectively electrically connected to said fifth conductive portion.

* * * * *

UNITED STATES PATENT AND TRADEMARK OFFICE
CERTIFICATE OF CORRECTION

PATENT NO. : 7,255,575 B2 Page 1 of 1
APPLICATION NO. : 11/584137
DATED : August 14, 2007
INVENTOR(S) : Yoshiei Hasegawa It is certified that error appears in the above-identified patent and that said Letters Patent is hereby corrected as shown below:

On the Title Page Item (76), the inventor's address should be corrected from "2-B" to --2-8--

Signed and Sealed this

Eighth Day of July, 2008

JON W. DUDAS
*Director of the United States Patent and Trademark Office*